(12) United States Patent
Moghe et al.

(10) Patent No.: US 6,180,437 B1
(45) Date of Patent: Jan. 30, 2001

(54) ADAPTABLE MMIC ARRAY

(75) Inventors: Sanjay B. Moghe, Hoffman Estates; Gregory R. Dietz, Schaumburg, both of IL (US); Howard N. Fudem, Baltimore, MD (US)

(73) Assignee: Northrop Grumman Corporation, Los Angeles, CA (US)

( * ) Notice: Under 35 U.S.C. 154(b), the term of this patent shall be extended for 0 days.

(21) Appl. No.: 09/109,150

(22) Filed: Jan. 27, 1998

Related U.S. Application Data

(62) Division of application No. 08/712,539, filed on Sep. 11, 1996, now Pat. No. 5,757,041.

(51) Int. Cl.⁷ ................................................. H01L 21/82
(52) U.S. Cl. .......................... 438/128; 438/129; 438/598
(58) Field of Search .................................. 438/128, 129, 438/598, 599

(56) References Cited

U.S. PATENT DOCUMENTS

| | | |
|---|---|---|
| 3,643,232 | 2/1972 | Kilby . |
| 3,808,475 | 4/1974 | Buelow et al. . |
| 3,984,860 | 10/1976 | Logue . |
| 4,751,482 | 6/1988 | Fukuta et al. . |
| 4,789,645 | 12/1988 | Calviello et al. . |
| 4,825,107 | 4/1989 | Naganuma et al. . |
| 4,885,625 | 12/1989 | Sunter et al. . |
| 4,924,287 | 5/1990 | Orbach . |
| 4,959,705 | 9/1990 | Lemnios et al. . |
| 5,111,273 | 5/1992 | Orbach et al. . |
| 5,162,258 | 11/1992 | Lemnios et al. . |
| 5,187,555 | 2/1993 | Kuroda et al. ........................ 257/202 |

OTHER PUBLICATIONS

Turner et al. "Application Specific MMIC: A Unique and Affordable Approach to MMIC Development", IEEE Jun. 1988 Microwave and Millimeter-Wave Monolithic Circuits Symposium.*

* cited by examiner

*Primary Examiner*—Kevin M. Picardat
(74) *Attorney, Agent, or Firm*—Terry J. Anderson; Karl J. Hoch, Jr.

(57) ABSTRACT

A footprint for adaptable MMIC arrays is disclosed in which the size, number and location of the array components is optimized for the fabrication by depositing a personalizing metal interconnecting layer on the array, of essentially any MMIC circuit from a single footprint layout.

5 Claims, 8 Drawing Sheets

ADAPTABLE MMIC ARRAY

This application is a division of application Ser. No. 08/712,539, filed Sep. 11, 1996 now U.S. Pat. No. 5,757,041.

FIELD OF THE INVENTION

This invention relates to microwave monolithic integrated circuits and more particularly to an improved footprint for a multipurpose partially fabricated chip.

BACKGROUND OF THE INVENTION

In the fabrication of microwave monolithic integrated circuits (MMICs), it is often necessary to design application-specific circuits of which only a relatively small number will ever be made. Integrated circuit design and manufacture is notoriously expensive, not only because it involves a great deal of work on the part of the engineering professionals and highly skilled technicians, but also because each manufactured circuit must be individually characterized to deal with inherent slight differences in the manufacturing process of the semiconductor layers.

To overcome this problem and make MMIC design more affordable, it has previously been proposed by Turner et al. in the article "Application Specific MMIC: A Unique and Affordable Approach to MMIC Development (IEEE Microwave and Millimeter-Wave Monolithic Circuits Symposium, 1988) to manufacture a footprint consisting of all of the chip circuitry, except for the metallic interconnection layer, in quantity on large wafers, and to build different kinds of circuits by subsequently covering the footprint with an appropriate metallic interconnection layer.

Basically, the footprint or MMIC array is a monolithic microwave integrated circuit (MMIC) chip which has a set pattern or array of unconnected field effect transistors (FETs), diodes and N+ and nichrome resistors. An entire wafer can have this array repeated across its surface. Multiple wafers can thus be processed and put into storage. When circuits are needed quickly for a program, a variety of masks for the formation of metallic and dielectric layers defining capacitors, interconnection between the footprint elements, and airbridges can be rapidly produced or taken from a library of pre-designed mask sets. Thus, a variety of metallic and dielectric patterns can be easily added to identical footprint chips to form a variety of microwave circuits, and the types of circuits and quantity of circuits needed can be quickly acquired. Another significant advantage to having an array which allows for many types of circuits to be realized and wafers to be fabricated and stored, is that once the first wafers finished with top metallization are characterized, then all the remaining wafers will have very similar electrical characteristics. This then removes much of the design risk inherent in MMIC design, i.e. the process variation from the nominal models used in design. Once the wafers are characterized, exact models can be used instead of statistical models.

In practice, an important aspect of the manufacture of footprint chips that lend themselves to the realization of a commercially viable number of different microwave circuits is the nature and placement of the chip components. Prior art approaches to the footprint technique encountered problems because the positioning of the circuit elements on the footprint made it difficult to design interconnection layers for many different applications. Also, it was difficult to change the value of the nichrome resistors on the chip from one application to another, or to so interconnect the chip components as to allow operation in the multi-gigahertz range.

Although prior art footprints have proven generally suitable for their intended purposes, they possess inherent deficiencies which detract from their overall effectiveness and desirability. Specifically, the prior art approach has several notable deficiencies which limit its practical applicability. For one, it includes low frequency components intermixed with microwave components of the footprint thereby wasting 25% to 75% of the available chip area. Each quadrant of the prior art footprint is specialized for a specific type of function, thereby reducing its flexibility and reusability.

Secondly, the prior art does not have dual axis symmetry (i.e. symmetry about both the x axis and the y axis). The prior art footprints have only x-axis symmetry. The lack of this symmetry degrades MMIC performance when the circuit design is balance driven (i.e. push-pull amplifiers, double balanced mixers, etc.). Mixers especially require dual axis symmetry due to their having 3 ports, each of which should be symmetrical. Another very important benefit of dual axis symmetry is the ability to mirror or rotate designs 180° to facilitate layout of larger scale integrations and allow manipulation of relative I/O port locations.

Thirdly, the prior art has gate connections on only one side of the FETs. This tends to introduce layout parasitics and leads to awkward circuit implementations.

Fourthly, the prior art footprints use a coplanar ground approach to allow the use of wafer probe testing; however, coplanar circuits require large amounts of "real estate" to form top-side ground planes.

Lastly, the above-mentioned prior art disclosure requires a total of seven separate footprints to realize a limited array of functions. The need for many different footprints reduces the usefulness of the adaptability concept. If a semiconductor wafer is populated with many different footprints and each one is only suited to a narrow range of applications, then the option to replicate only one or two designs across the entire wafer is not possible without wasting the remaining footprint sites. This would be important if a single design were needed in high volume.

It is therefore desirable to provide a footprint which is highly adaptable to a large variety of circuits with relatively simple interconnection designs.

SUMMARY OF THE INVENTION

In accordance with the invention, an optimum quantity, type and location of FETs, diodes, resistors, and substrate via holes has been developed to provide a footprint which allows almost any MMIC circuit to be realized by connecting components of the footprint with metallic or metallic and dielectric personalizing layers formed over the basic footprint. Knowing the position and values of the components, and the electrical parameters of a circuit to be created, conventional computer-aided design techniques can advantageously be used to produce a mask which will most efficiently provide the necessary interconnections.

More particularly, the present invention overcomes the above-identified deficiencies of the prior art by providing a footprint which has the following features:

1) A pair of substrate ground via holes are located near the gate connections to facilitate high frequency performance;
2) The FETs are made from many individual FET fingers or segments allowing FETs of different sizes to be fabricated by connecting two or more of them in parallel;

3) The FETs' gate connection is formed to allow the connection to be made from either side of the FET. This adds flexibility to the layout and allows for symmetry;

4) The footprint array is symmetrical about both the X and Y axes, thus allowing balanced and/or mirrored circuit layouts to be produced;

5) Nichrome (NiCr) resistors are located near the substrate via holes for DC bias as well as for microwave impedance matching;

6) The NiCr resistors are split into many small resistors to allow for proper thermal dissipation, thus assuring high reliability;

7) The value of the NiCr resistors in the footprint is made variable by changing the overlap of the top metallization;

8) The FETs' gate width is preferably 75 $\mu$m to allow for operation at frequencies up to about 20 GHz. Alternatively, a gate width of 50 $\mu$m can be used for frequencies in excess of 40 GHz;

9) The size of the components and the spacings between components allows for the formation of airbridges to span over unused components, as well as for metal lines to pass between components without interfering with the components;

10) The FET gates are spaced by a minimum of 17 $\mu$m to allow for good thermal dissipation, again assuring high reliability and also radio frequency (RF) isolation from neighboring FET sections.

In accordance with another aspect of the invention, the footprint of this invention may be provided with one or more "keepout" zones which contain an array of FETs, resistors and diodes useful in building digital and analog auxiliary circuits to form specialized functions discussed in more detail hereafter. The keepout zones are not part of the high-frequency circuitry but their components can be advantageously fabricated on the chip together with the MMIC footprint.

In the preferred use of the inventions, a few different versions of the unmetallized MMIC chip (i.e. chips having only a semiconductor layer with component contacts and nichrome resistors) are originally produced in quantity on semiconductor wafers. These versions all have the same microwave footprint, and differ only in the layout of the keepout zone so as to provide different low-frequency auxiliary devices on the chip for use with the microwave circuits subsequently formed on the footprint. Separate sets of interconnection masks are then designed for each specific device such as amplifiers, oscillators, mixers, baluns, logic circuits or the like. These masks are stored in a library, and when one of these devices is needed, the appropriate mask is used to metallize a wafer carrying the generic footprint. The inventive design provides 4 or 5 basic personalization layers, i.e. layers which can then be combined in various ways to create a large variety of specific circuits when applied to the inventive footprint.

BRIEF DESCRIPTION OF THE DRAWINGS

FIG. 3b is a block diagram of the circuit of FIG. 3a;

FIGS. 4a, 4b and 4c are plan views, respectively, of the inventive footprint with a first version of keepout zone elements; of the metallization pattern used with that footprint to form a 2–6 GHz logarithmic amplifier; and of the composite (with the footprint elements shown in black) obtained by applying the metallization pattern of FIG. 4b to the footprint of FIG. 4a;

FIGS. 5a, 5b and 5c are plan views, respectively, of the inventive footprint with a second version of keepout zone elements; of the metallization pattern used with that footprint to form a 12–18 GHz oscillator with 2-stage buffer amplifier; and of the composite (with the footprint elements shown in black) obtained by applying the metallization pattern of FIG. 5b to the footprint of FIG. 5a.

DESCRIPTION OF THE PREFERRED EMBODIMENT

Figure 1:
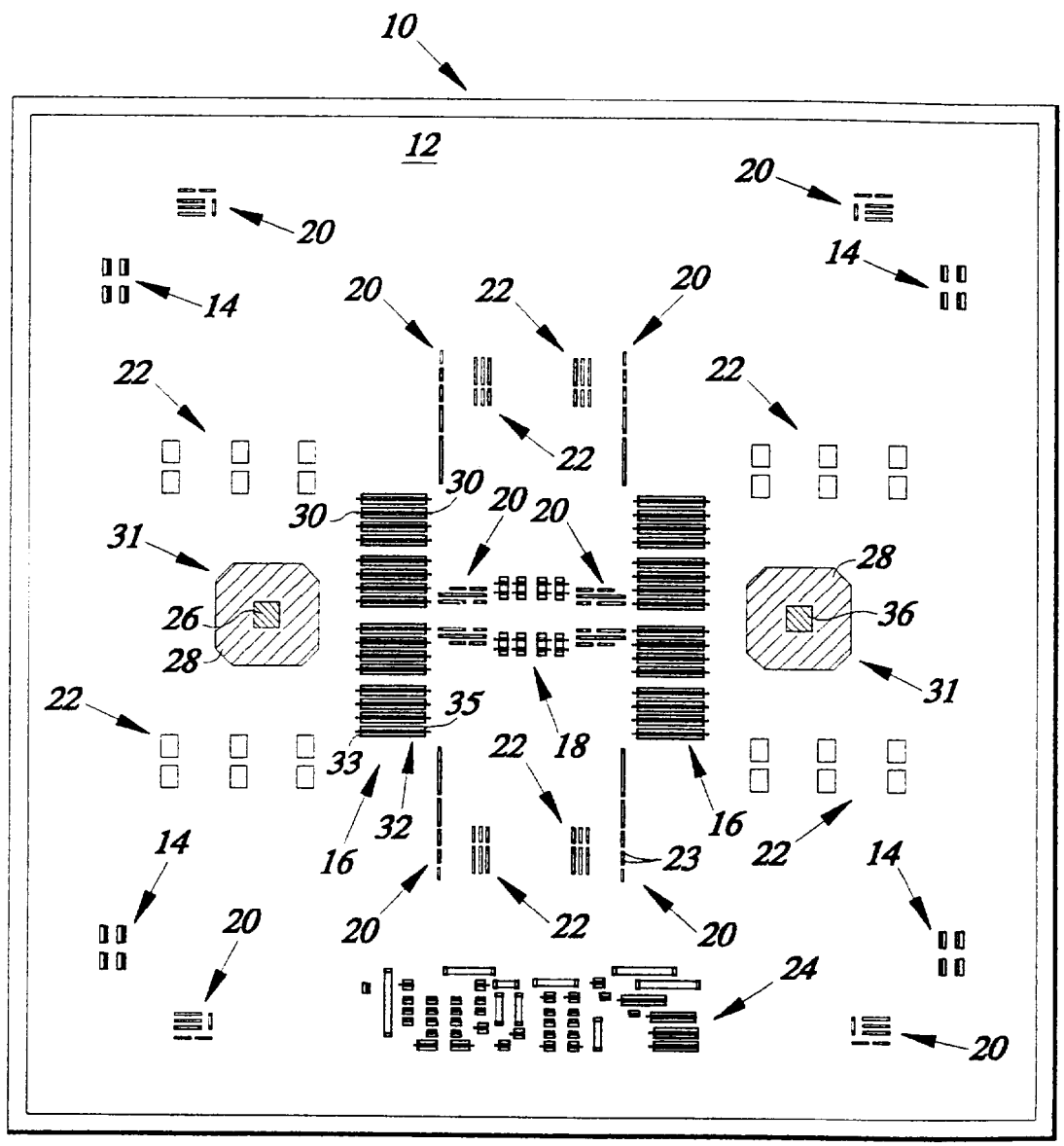
FIG. 1 is a plan view of a chip containing the basic footprint of this invention.

FIG. 1 shows the basic footprint 10 of this invention on a GaAs chip 12. Certain components of this footprint are formed from the GaAs chip itself. These include overlay diodes 14, FETs 16, and N+ resistors 20. In addition, metallic nichrome resistors 22 and ohmic contact pads 23 for the N+ resistors 20 are formed on the chip 12 as part of the footprint 10. Additional components may be formed in the keepout zone 24 discussed hereinbelow. Finally, substrate via holes 26 surrounded by metallic grounding pads 28 are provided on the chip 12 for connecting circuit elements to a ground plane (not shown) on the underside of the chip 12.

The layout of the foregoing footprint elements is such that the footprint 10 is symmetrical in both the x and y direction except for the keepout zone 24. This allows circuits to be mirrored on multi-footprint chips even though all the footprints face in the same direction. In accordance with the invention, the footprint 10 uses a specific placement and configuration of the circuit components on the chip 12. It has been found that versatility of the footprint for the fabrication of MMICs can be unexpectedly expanded by that placement.

Specifically, in accordance with the invention, the FETs 16 are formed with gate feeds 30 on both ends of the FETs 16 to allow connection of the gate to the circuit from either end. This not only gives the footprint considerable flexibility in avoiding lengthy interconnections, but also enhances the symmetry of the footprint. High-value resistors such as the N+ resistors 20, which typically have a resistance of 125 $\Omega$ per square, are positioned close to the FET gate terminals 30 for supplying gate bias. The substrate vias 31 are located as near as possible to the FETs' source connection 33 to minimize high-frequency lead lengths.

The footprint 10 of this invention uses N+ resistors 20 of varying sizes, plus large, medium and small NiCr resistors 22. The N+ resistors 20 are used as low current, high resistance circuit elements in which precision and temperature stability are of secondary importance. Their advantage is that they are formed as part of the chip semiconductor layer, and therefore require no extra processing. However, the value of each N+ resistor 20 is determined by the size of the implant region and the location of the ohmic contacts and cannot be changed by the personalizing metallization. Consequently, enough different sizes of N+ resistors 20 must be provided in the footprint 10 to allow the creation of a desired N+ resistor value by piecing several N+ resistors together.

The formation of NiCr resistors 22 requires a separate processing step for the footprint 10 and thereby makes it more expensive, but the NiCr resistors 22 have the advantage of being very precise and temperature-stable. They have a relatively high current capacity and low sheet resistance, and they are easily modified to have a specific desired resistance. This can be done simply by shorting out portions of their surface with the personalizing metallization. The large nichrome (ca. 50 Ω per square) resistors 22 adjacent the substrate vias 31 are so positioned because they are typically used for bias as well as for microwave matching. The smaller nichrome resistors 22 are useful for general microwave circuit design and matching.

The low current N+ diodes 18 are clustered close together for use as diode quads in double-balanced mixers. Medium-sized N+ resistors 20 between the diodes 18 and the FETs 16 are located near the FET drains 35 for negative feedback networks. The overlay diodes 14 are located near the corners of the footprint 10 because these large-current diodes are typically used for DC biasing and need to be near the DC power inputs. Capacitors of any desired size can be formed at any desired location on the chip 12 during personalization by depositing at least two personalizing metallization layers separated by a dielectric layer.

Those skilled in the art will realize that the inventive footprint 10 makes the footprint extremely versatile, yet allows the circuit elements to be interconnected with leads of minimal lengths. This is important for circuits operating at very high frequencies such as 40 GHz. Another advantage of the footprint 10 is that it allows the hardest-to-fabricate components (mainly the FETs 16) to be fabricated first. Thus, the FETs 16 can be tested (and rejected if defective) early in the fabrication process, so that the odds that the circuits will perform satisfactorily after the subsequent layers are applied are greatly increased. The resulting improvement in processing certainty is important for tight-schedule production.

Another aspect of the inventive footprint is that the FETs 16 are made from thirty-two individual FET fingers 32 clustered near the center of the chip 12. This allows FETs 16 of various sizes to be created by appropriate connection lead patterns in the personalizing metallization layers. In a preferred embodiment of the invention, the gate width of the FET fingers 32 is 75 μm for operation up to about 20 GHz, or 50 μm for operation up to about 40 GHz.

The size of the components of the footprint 10 and the spacing between the components is so chosen in the invention that airbridges can be formed across components, and that metal lines can pass between components, without either of them interfering with the operation of the component. Also, the footprint 10 takes into account the need for adequate thermal dissipation to assure high reliability. For that reason, the nichrome resistors 22 are split into twelve large and twelve small resistors spaced from each other. Likewise, the FETs 16 are spaced from each other by a minimum of 17 μm. This spacing provides the FET fingers with high reliability and RF isolation from neighboring FET sections. It thus allows small FET segments to be electrically isolated from each other, and to be used independently of each other.

Figure 4A:
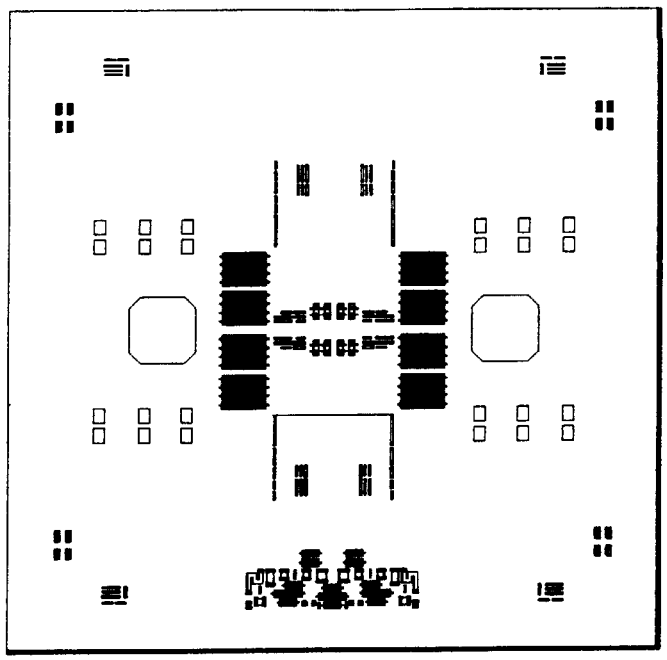
Figure 4B:
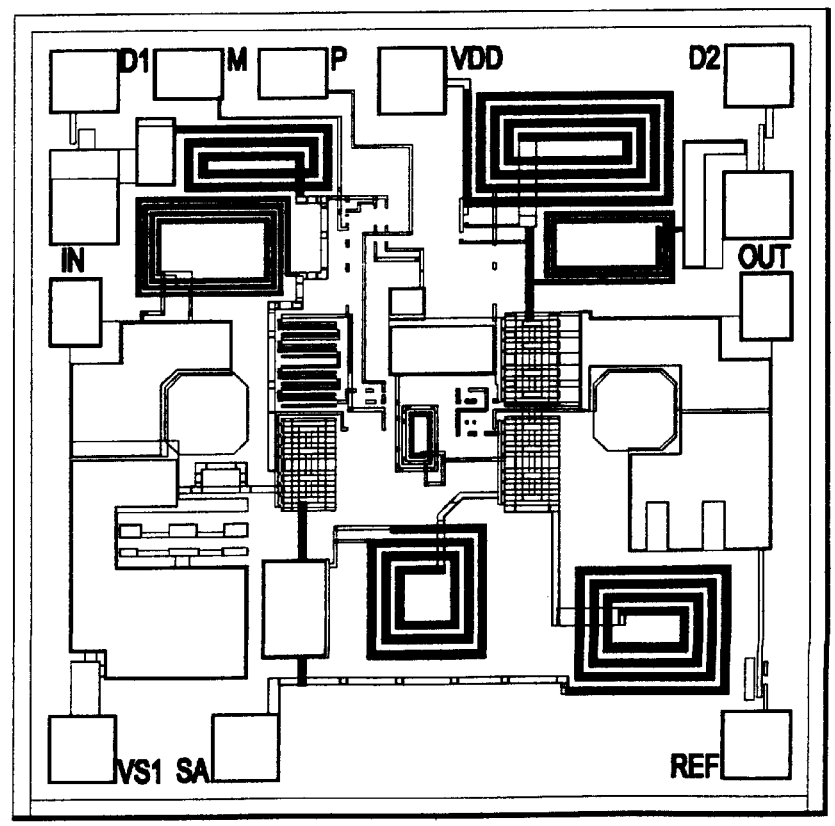
Figure 5A:
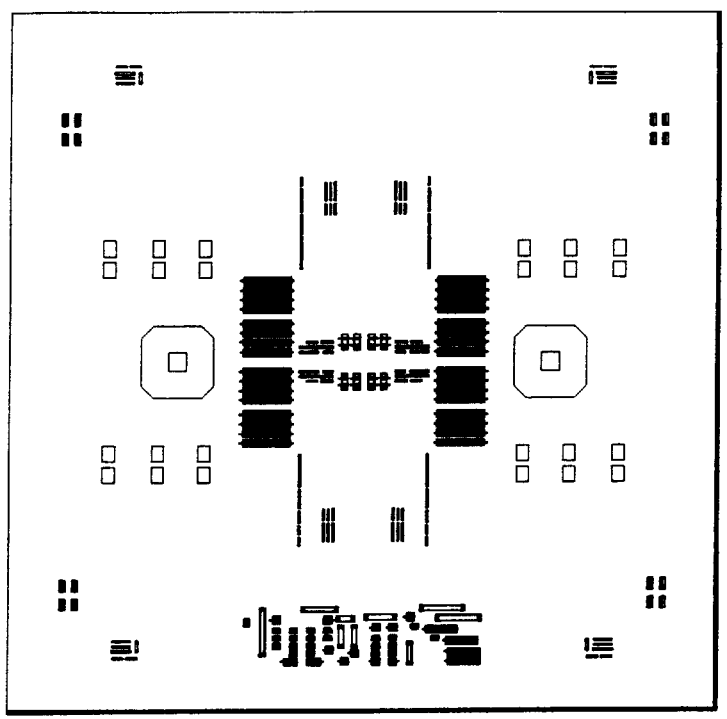
Figure 5B:
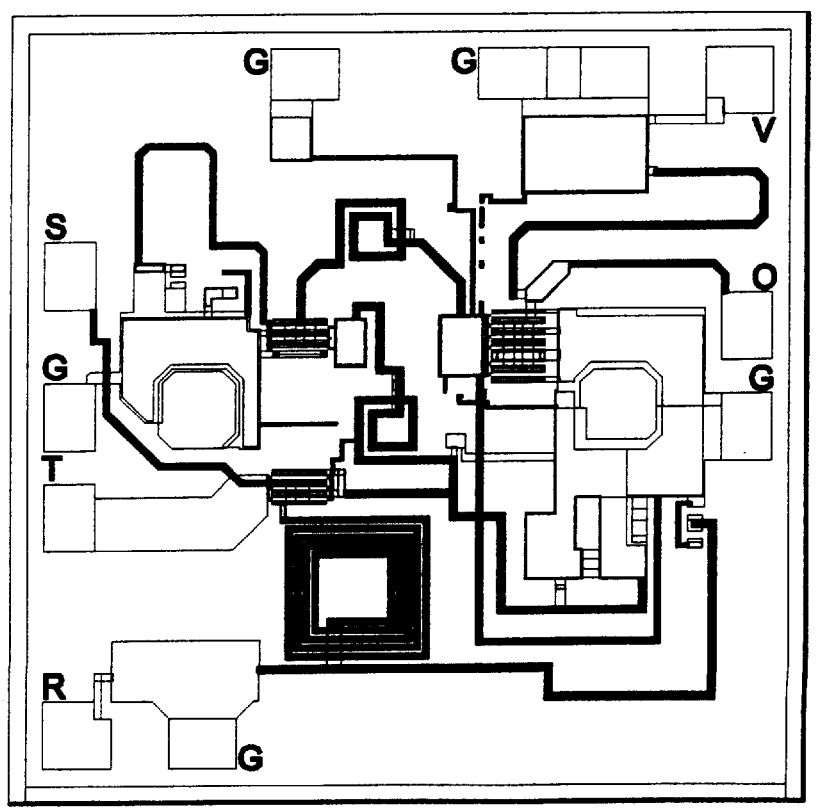

Representative circuits using the inventive footprint 10, some of them using complex power-saving DC bias schemes, which have been fabricated and tested include:

1) 8–20 GHz amplifier
2) 6–18 GHz amplifier
3) 6–18 GHZ converter (mixer/DRO/LO amplifier/IF amplifier)
4) 10–18 GHz oscillator
5) 10–18 GHz oscillator with buffer amplifier
6) 2–6 GHz low noise amplifier
7) 2–6 GHz medium power amplifier
8) 2–7 GHS temperature stabilized amplifier
9) 3 GHz dual gate FET variable gain amplifier
10) 2–4 GHz converter (mixer/LO amplifier)
11) 0.1–2 GHz amplifier
12) 2–5 GHz sequential log video amplifier
13) 6–18 GHz dual mixer with LO amplifiers
14) 2–4 GHz spurious rejection mixer
15) 2–7 GHz mixer
16) UHF oscillator
17) DC to 18 GHz SPDT switch A special feature of the inventive adaptable MMIC array is the provision of the keepout zone 24. That zone, which is preferably symmetrical about only one axis of the chip 12 so as to save interconnection space for the footprint 10, is in effect a second, independent adaptable array. Its purpose is to provide, on the chip 12, a way to form separate low-frequency auxiliary circuits to provide support for the microwave circuits covering the main portion of the footprint 10. Preferably, the footprint wafers are fabricated with two or three different keepout zone arrays which are particularly adapted to the production of different types of auxiliary circuits. Two of these keepout zone arrays 24a and 24b are shown, as a matter of example, in FIG. 4a and the upper left and lower right quadrants of FIG. 2, and in FIG. 5a and the lower left quadrant of FIG. 2, respectively. A third keepout zone array 24c is shown in the upper left quadrant of FIG. 2.

The area occupied by the keepout zone 24 is not available for microwave circuit conductors in a metallization layer except, of course, for conductors connecting elements of the footprint 10 to the FETs, resistors and diodes provided in the keepout zone 24. However, the keepout zone 24 is small enough to where it does not significantly interfere with the design of the metallizing layers. The components of the keepout zone 24 are located for stacking diodes for level shifting, and are spaced the proper distance to allow routing metal interconnections. The keepout zone's FETs are also located for stacking and repeated for multi-stage use.

Figure 2:
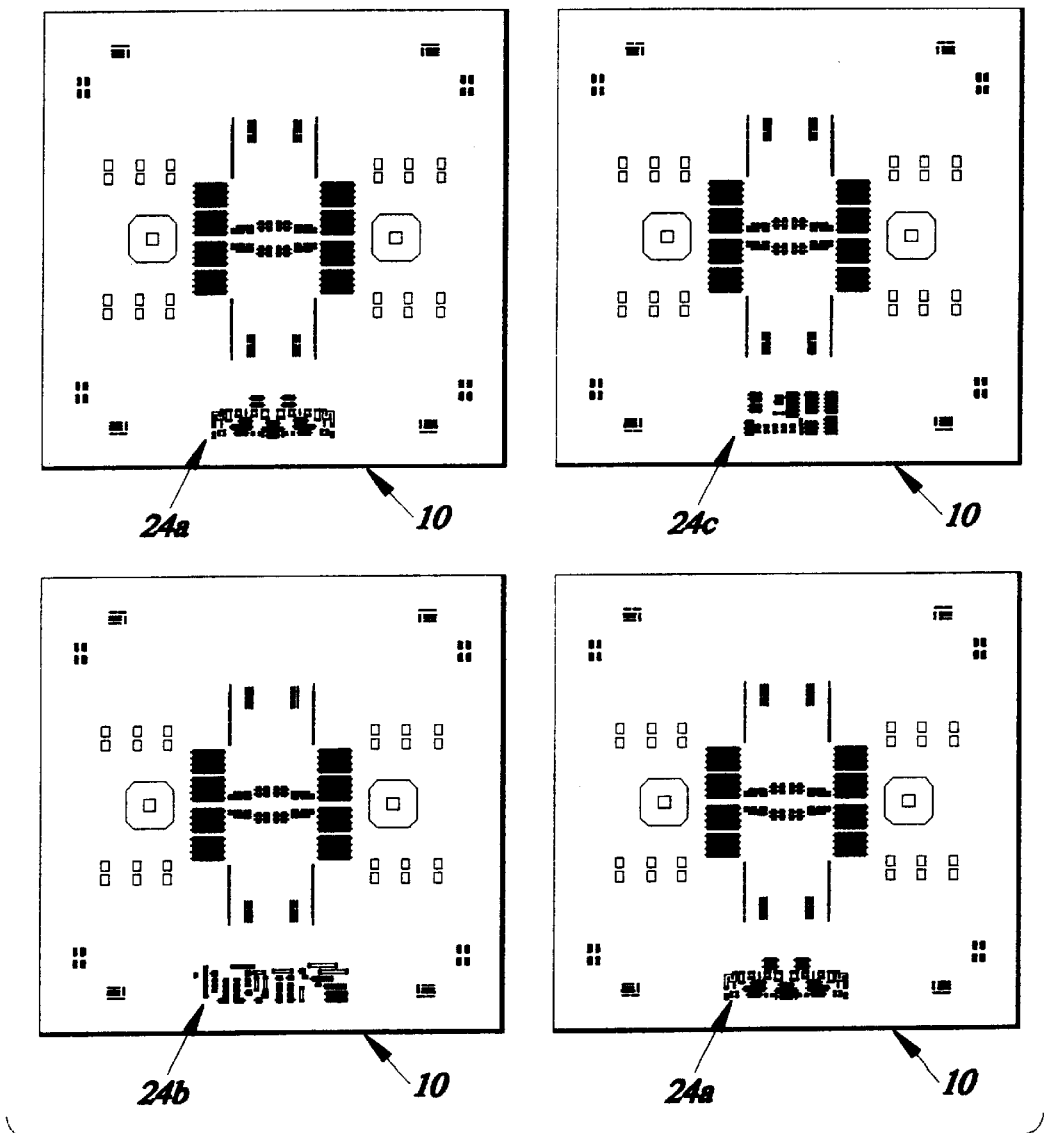
FIG. 2 is a plan view of a four-footprint array.
Figure 3A:
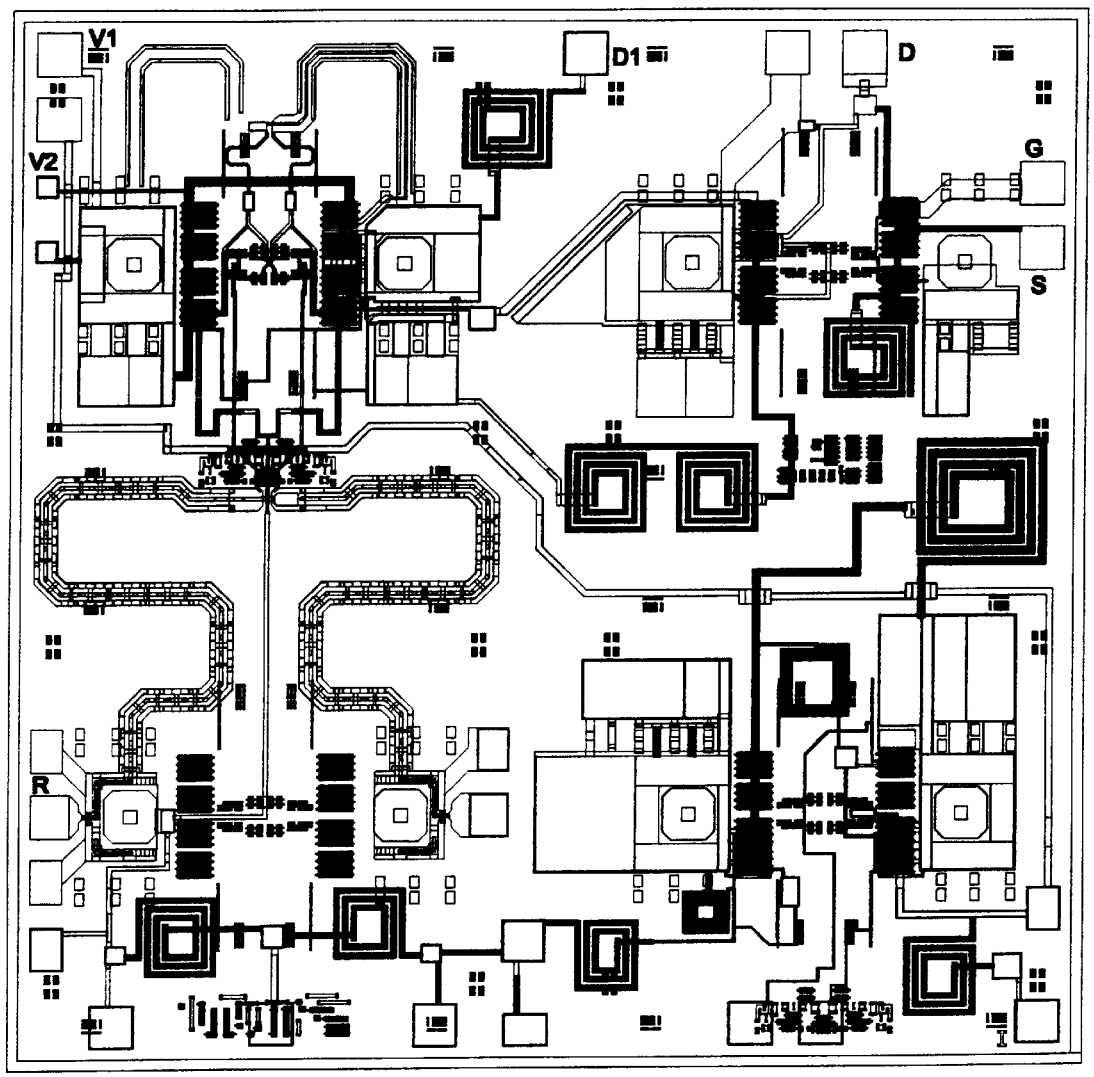
FIG. 3a is a plan view of an advanced downconverter MMIC created by metallizing the array of FIG. 2.
Figure 3B:
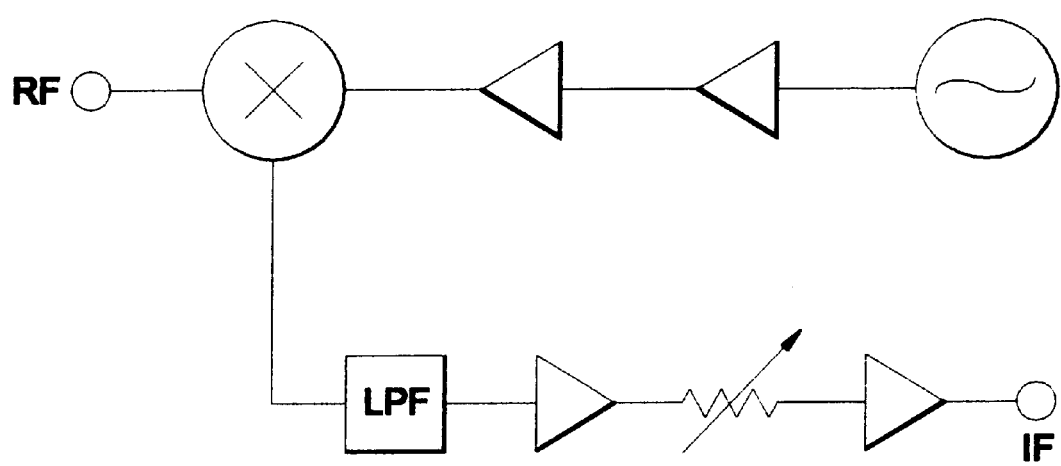
Figure 4C:
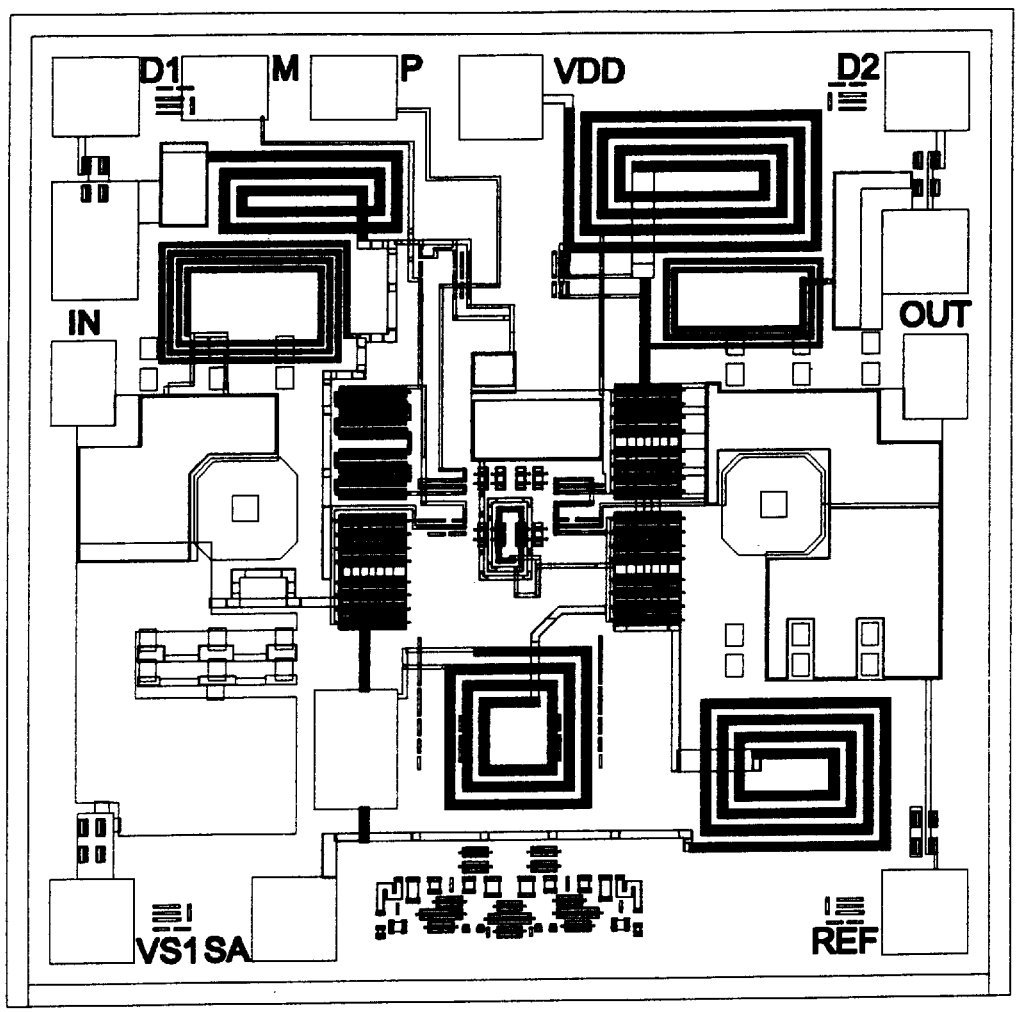
Figure 5C:
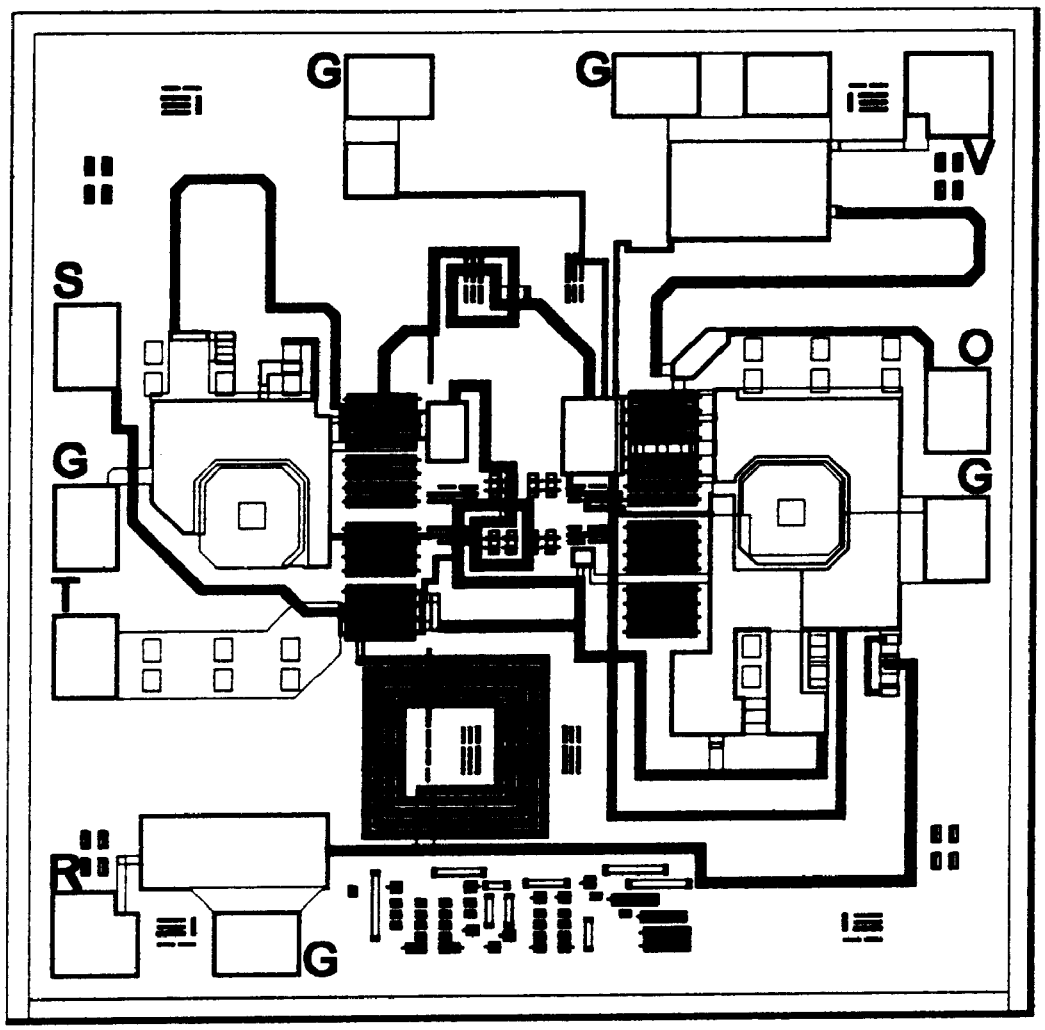

The nature and power capacities of the individual circuit elements in keepout zone 24 are so chosen as to allow the realization of digital and/or analog circuits which can be used with the main circuit to form complex functions. For example, representative circuits that can be made from the footprint 10 with the use of the components in keepout zone 24 include:

1) operational amplifier
2) switch driver
3) 200–2000 MHz amplifier
4) DC to 500 MHz amplifier
5) 200–2000 MHz double balanced mixer
6) 200–2000 MHz active balun
7) digital master/slave D flip-flop The versatility of the footprint of FIG. 1 is illustrated herein by FIG. 3a, which takes advantage of the four-footprint block of FIG. 2 to create a single complex MMIC circuit (in this instance as illustrated by FIG. 3b, a 6–18 GHz mixer with two-stage LO and IF amplifiers, an oscillator and a single 8V, 110 mA supply on a 2.5×2.5 mm chip). Other representative circuits constructed from the footprint 10 of FIG. 1 are shown in FIGS. 4c and 5c.

It is understood that the exemplary adaptable MMIC array described herein and shown in the drawings represents only a presently preferred embodiment of the invention. Indeed, various modifications and additions may be made to such embodiment without departing from the spirit and scope of the invention. Thus, other modifications and additions may be obvious to those skilled in the art and may be implemented to adapt the present invention for use in a variety of different applications.

What is claimed is:

1. A method of fabricating a plurality of different circuits on identical monolithic microwave integrated circuit chips, comprising the steps of:
   a) forming on a chip substrate circuit components used in at least one of said circuits, said forming including the step of arranging circuit components about the substrate such that the components are substantially equally distributed and spaced about the substrate to provide dual access symmetry of the components in the substrate;
   b) providing a plurality of different masks defining the interconnections between said components necessary to define a given circuit;
   c) metallizing said chip substrate with a selected mask; and
   d) said components including discrete sub-components which can be paralleled to form said components, said metallizing step including the step of so paralleling said components.

2. The method of claim 1, in which said sub-components are resistors.

3. The method of claim 1, in which said sub-components are so disposed on said substrate as to minimize the length of their interconnections.

4. The method as recited in claim 1 further comprising the step of separating low frequency and high frequency components on the substrate.

5. The method as recited in claim 1 further comprising the step of forming gate connections about opposing sides of components and spacing the components to allow metal lines to pass therebetween without connecting to the components.

* * * * *